(12) United States Patent
     Tada (10) Patent No.: US 11,476,886 B2
(45) Date of Patent: Oct. 18, 2022

(54) RADIO FREQUENCY MODULE AND COMMUNICATION DEVICE

(71) Applicant: Murata Manufacturing Co., Ltd., Nagaokakyo (JP)

(72) Inventor: Masaki Tada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 24 days.

(21) Appl. No.: 17/221,852

(22) Filed: Apr. 5, 2021

(65) Prior Publication Data

US 2021/0320682 A1    Oct. 14, 2021

(30) Foreign Application Priority Data

Apr. 14, 2020   (JP) .............................. JP2020-072244

(51) Int. Cl.
     *H04B 1/40*       (2015.01)
     *H03F 3/24*       (2006.01)
     *H03F 1/56*       (2006.01)

(52) U.S. Cl.
     CPC ................. *H04B 1/40* (2013.01); *H03F 1/56* (2013.01); *H03F 3/245* (2013.01); *H03F 2200/222* (2013.01); *H03F 2200/294* (2013.01); *H03F 2200/451* (2013.01)

(58) Field of Classification Search
     None
     See application file for complete search history.

(56) References Cited

U.S. PATENT DOCUMENTS

| 11,251,829 | B2* | 2/2022 | Harada | H04B 1/50 |
| 2010/0253435 | A1* | 10/2010 | Ichitsubo | H01L 25/0655 29/832 |
| 2010/0321129 | A1* | 12/2010 | Onody | H03F 1/56 333/124 |
| 2011/0037170 | A1* | 2/2011 | Shinohara | H01L 21/565 257/737 |
| 2013/0207732 | A1* | 8/2013 | Cabanillas | H03F 1/565 330/192 |

(Continued)

FOREIGN PATENT DOCUMENTS

| JP | 2018-137522 A | 8/2018 |
| KR | 10-2018-0018984 A | 2/2018 |
| WO | 2019/244815 A | 12/2019 |

OTHER PUBLICATIONS

Korean Office Action dated Nov. 26, 2021 in Korean Application No. 10-2021-0034417.

*Primary Examiner* — Pablo N Tran
(74) *Attorney, Agent, or Firm* — Xsensus LLP (57) ABSTRACT

A radio frequency module includes: a power amplifier; an inductor connected to the power amplifier; an external connection terminal that is connected to the power amplifier via the inductor and is configured to receive a power supply voltage from an outside source; a low-noise amplifier; a matching circuit connected to input of the low-noise amplifier; and a module substrate including a first principal surface and a second principal surface on opposite sides of the module substrate. The inductor is disposed on one of the first principal surface and the second principal surface, and the matching circuit is disposed on the other of the first principal surface and the second principal surface.

20 Claims, 5 Drawing Sheets

(56) References Cited

U.S. PATENT DOCUMENTS

| 2015/0070096 | A1* | 3/2015 | Watanabe | H03F 3/195 |
| | | | | 330/296 |
| 2021/0203371 | A1* | 7/2021 | Hanaoka | H01L 24/92 |
| 2021/0320682 | A1* | 10/2021 | Tada | H03F 1/56 |

* cited by examiner

RADIO FREQUENCY MODULE AND COMMUNICATION DEVICE

CROSS-REFERENCE TO RELATED APPLICATION

The present application is based on and claims priority of Japanese Patent Application No. 2020-072244 filed on Apr. 14, 2020. The entire disclosure of the above-identified application, including the specification, drawings and claims is incorporated herein by reference in its entirety.

TECHNICAL FIELD

The present disclosure relates to a radio frequency module and a communication device.

BACKGROUND

In mobile communication apparatuses such as a mobile phone the arrangement configuration of circuit elements included in radio frequency front-end circuits is becoming complex, particularly with developments in multiband technologies.

Patent Literature (PTL) 1 (Japanese Unexamined Patent Application Publication No. 2018-137522) discloses an RF module in which many electronic components such as power amplifiers, low-noise amplifiers, and filters are packaged.

SUMMARY

Technical Problems

In the above-described conventional technique, many components are integrated to downsize a module. This integration reduces isolation characteristics between components and between lines, thereby deteriorating electrical characteristics (e.g., noise figure (NF), gain characteristics) of a radio frequency module.

In view of the above, the present disclosure provides a radio frequency module and a communication device that are capable of improving electrical characteristics.

Solutions

A radio frequency module according to one aspect of the present disclosure includes: a power amplifier; an inductor connected to the power amplifier; an external connection terminal that is connected to the power amplifier via the inductor and is configured to receive a power supply voltage from an outside source; a low-noise amplifier; a matching circuit connected to input of the low-noise amplifier; and a module substrate including a first principal surface and a second principal surface on opposite sides of the module substrate. The inductor is disposed on one of the first principal surface and the second principal surface, and the matching circuit is disposed on the other of the first principal surface and the second principal surface.

Advantageous Effects

According to the present disclosure, it is possible to improve the electrical characteristics of a radio frequency module including components.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, exemplary embodiments of the present disclosure will be described in detail with reference to the drawings. It should be noted that each of the subsequently described exemplary embodiments shows a generic or specific example. The numerical values, shapes, materials, elements, the arrangement and connection of the elements, etc. indicated in the following exemplary embodiments are mere examples, and there are not intended to limit the present disclosure.

It should be noted that the drawings are schematic diagrams in which emphasis, omission, or ratio adjustment has been applied where necessary to illustrate the present disclosure. The drawings are thus not necessarily exact illustration of the present disclosure, and may illustrate shapes, positional relationships, and ratios differently from the actual ones. In the figures, elements that are substantially the same are given the same reference signs, and overlapping description may be omitted or simplified.

In the figures, the x-axis and the y-axis are orthogonal to each other on a plane parallel to a principal surface of a module substrate. In addition, the z-axis is vertical to the principal surface of the module substrate, and a positive direction of the z-axis indicates am upper direction and a negative direction of the z-axis indicates a downward direction.

In a circuit configuration of the present disclosure, the term "connected" means not only a case where elements are directly connected via a connection terminal and/or a wiring conductor but also a case where elements are electrically connected via another circuit element. The expression "connected between A and B" means connected to both A and B between A and B.

In a component layout of the present disclosure, the expression "a plan view of a module substrate" means viewing an object from a z-axis positive side by orthographic projection of the object onto the xy-plane. The expression "A overlaps B in a plan view of a module substrate" means that at least part of a region of A orthographically projected onto the xy-plane overlaps at least part of a region of B orthographically projected onto the xy-plane. Moreover, the expression "a component is disposed on a substrate" means that a component is disposed on a substrate in contact with each other, that a component is disposed above a substrate without contact with each other (e.g., a component is stacked on another component disposed on a substrate), and further that part or all of a component is embedded in a substrate. Furthermore, the expression "a component is disposed on a principal surface of a substrate" means that a component is disposed on a principal surface of a substrate in contact with each other, that a component is disposed above a principal surface of a substrate without contact with each other, and further that part or all of a component is embedded in a substrate. Moreover, the expression "A is disposed between B and C" means that at least one of line segments joining an arbitrary point in B and an arbitrary point in C passes through A.

Furthermore, terms indicating a relationship between elements such as "parallel" and "vertical" mean not only expressions with strict meanings but also expressions with meanings including substantially the same range, for example, an error of several percent.

Embodiment 1

[1.1 Circuit Configurations of Radio Frequency Module 1 and Communication Device 5]

Figure 1:
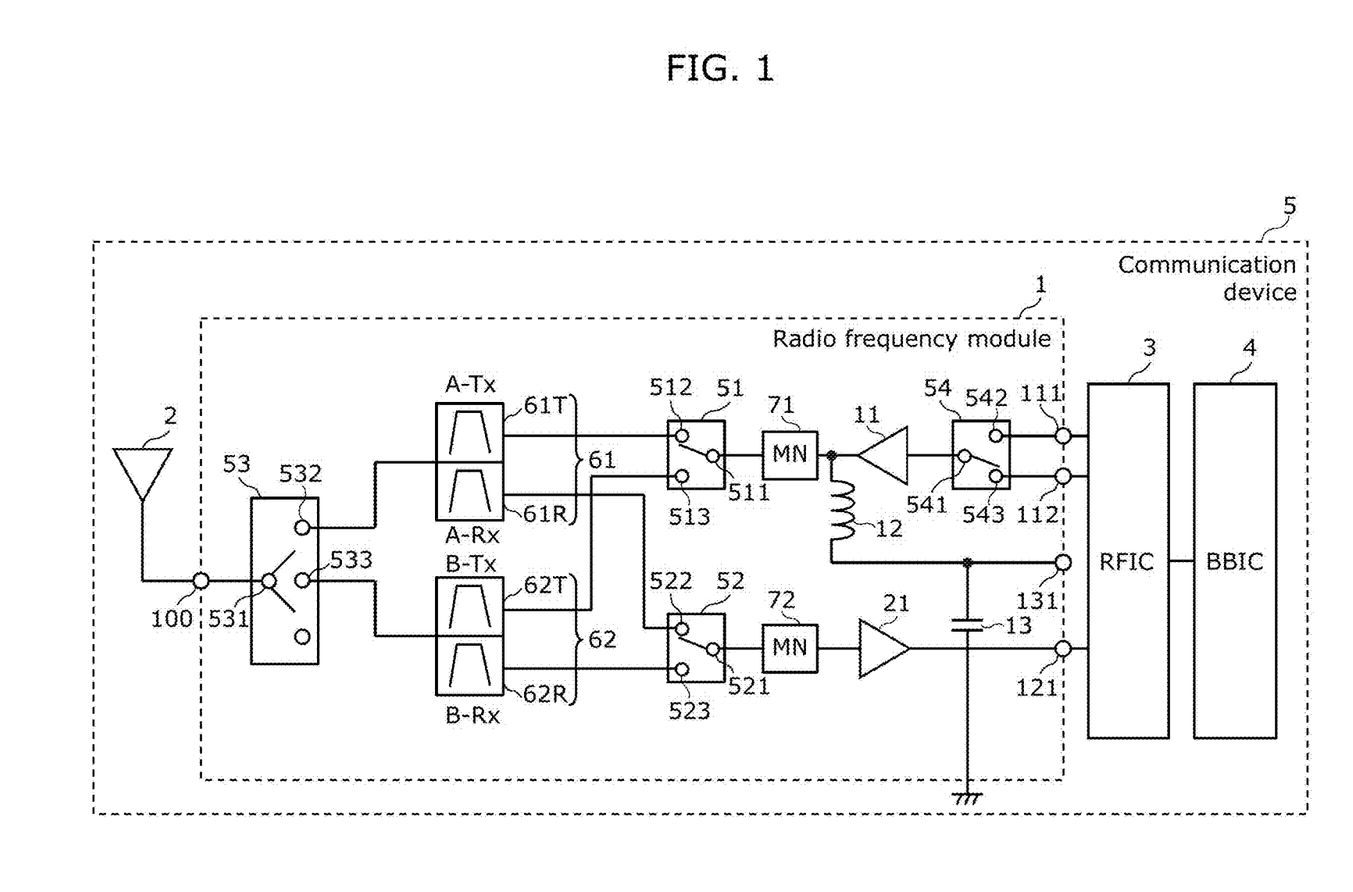
FIG. 1 is a circuit configuration diagram of a radio frequency module (or RF front-end circuitry) according to Embodiment 1.

Circuit configurations of radio frequency module 1 and communication device 5 according to the present embodiment will be described with reference to FIG. 1. FIG. 1 is a circuit configuration diagram of radio frequency module 1 and communication device 5 according to Embodiment 1.

[1.1.1. Circuit Configuration of Communication Device 5]

First, the circuit configuration of communication device 5 will be described. As shown by FIG. 1, communication device 5 according to the present embodiment includes radio frequency module 1, antenna 2, radio frequency processing circuit (RFIC) 3, and baseband signal processing circuit (BBIC) 4. Hereinafter, each of the elements of communication device 5 will be described in sequence.

Radio frequency module 1 transfers a radio frequency signal between antenna 2 and RFIC 3. The circuit configuration of radio frequency module 1 will be described later.

Antenna 2 is connected to antenna connection terminal 100 of radio frequency module 1, receives a radio frequency signal from the outside, and outputs the radio frequency signal to radio frequency module 1.

RFIC 3 is an example of a signal processing circuit that processes a radio frequency signal. Specifically, RFIC 3 performs, by downconversion etc., signal processing on a radio frequency reception signal inputted via a reception path of radio frequency module 1, and outputs the reception signal generated by the signal processing to BBIC 4. Furthermore, RFIC 3 includes a controller that controls switches, low-noise amplifiers, etc. of radio frequency module 1. It should be noted that part or all of the functionality as the controller of RFIC 3 may be implemented outside RFIC 3. For example, part or all of the functionality may be implemented in BBIC 4 or radio frequency module 1.

BBIC 4 is a baseband signal processing circuit that performs signal processing using an intermediate frequency band having a lower frequency than a radio frequency signal transferred by radio frequency module 1. A signal processed by BBIC 4 is used as, for example, an image signal for image display and/or a sound signal for communication via a speaker.

It should be noted that antenna 2 and BBIC 4 are optional, and thus not essential elements of communication device 5 according to the present embodiment.

[1.1.2. Circuit Configuration of Radio Frequency Module 1]

Next, the circuit configuration of radio frequency module 1 will be described. As shown by FIG. 1, radio frequency module 1 includes power amplifier 11, inductor 12, capacitor 13, low-noise amplifier 21, switches 51 to 54, duplexers 61 and 62, matching circuits (MNs) 71 and 72, antenna connection terminal 100, radio frequency input terminals 111 and 112, radio frequency output terminal 121, and power supply terminal 131.

Antenna connection terminal 100 is connected to antenna 2.

Radio frequency input terminals 111 and 112 are terminals for receiving radio frequency transmission signals from the outside of radio frequency module 1. For example, radio frequency signals for mutually different communication systems and/or radio frequency signals in mutually different communication bands can be used as radio frequency signals received from outside by radio frequency input terminals 111 and 112.

A communication system means a communication system constructed using a radio access technology (RAT). In the present embodiment, for example, a Fifth Generation New Radio (5G NR) system, a Long Term Evolution (LTE) system, a Wireless Local Area Network (WLAN) system, etc. can be used as communication systems. The present embodiment, however, is not limited to these examples.

A communication band means a frequency band defined in advance by a standards organization (e.g., 3rd Generation Partnership Project (3GPP), the Institute of Electrical and Electronics Engineers (IEEE)), for a communication system.

It should be noted that the number of radio frequency input terminals is not limited to two. For example, the number of radio frequency input terminals may be one or at least three.

Radio frequency output terminal 121 is a terminal for supplying a radio frequency reception signal to the outside of radio frequency module 1. It should be noted that radio frequency module 1 may include radio frequency output terminals.

Power supply terminal 131 is an example of an external connection terminal and is a terminal for receiving power supply voltage from the outside of radio frequency module 1. Power supply terminal 131 is connected to power amplifier 11 via inductor 12.

Power amplifier 11 is capable of amplifying radio frequency signals received by radio frequency input terminals 111 and 112. Specifically, power amplifier 11 is capable of amplifying radio frequency signals in communication band A and/or communication band B inputted from radio frequency input terminal 111 and/or radio frequency input terminal 112 via switch 54.

For example, power amplifier 11 may be a multistage amplifier. In other words, power amplifier 11 may include cascade-connected amplifying elements. In this case, the number of stages of power amplifier 11 is not particularly limited. Alternatively, power amplifier 11 may include a single-stage configuration. Moreover, power amplifier 11 may convert a radio frequency signal into a differential signal (i.e., a complementary signal) and amplify the differential signal. Such power amplifier 11 may be referred to as a differential amplifier. In this case, an output of power amplifier 11 may be a differential signal. It should be noted that the configuration of power amplifier 11 is not limited to these examples.

Inductor 12 is connected between power supply terminal 131 and power amplifier 11. Inductor 12 is capable of preventing a radio frequency signal from flowing from a radio frequency signal line for transferring radio frequency signals to a power supply line for supplying power supply voltage, and is capable of preventing power supply noise from flowing from the power supply line to the radio frequency signal line. In other words, inductor 12 serves as what is called a choke coil.

Capacitor 13 is connected between a ground and a path connecting power supply terminal 131 and inductor 12. To put it differently, capacitor 13 is connected between a ground and a node between power supply terminal 131 and inductor 12. Capacitor 13 is capable of reducing a variation in power supply voltage. Moreover, as with inductor 12, capacitor 13 is capable of preventing a radio frequency signal from flowing from a radio frequency signal line to a power supply line, and is capable of preventing power supply noise from flowing from the power supply line to the radio frequency signal line. In other words, capacitor 13 serves as what is called a bypass capacitor or a decoupling capacitor.

Low-noise amplifier 21 is capable of amplifying radio frequency signals received by antenna connection terminal 100. Specifically, low-noise amplifier 21 is capable of amplifying radio frequency signals in communication bands A and B inputted from antenna connection terminal 100 via switch 53 and duplexers 61 and 62. The radio frequency signals amplified by low-noise amplifier 21 are outputted to radio frequency output terminal 121. The configuration of low-noise amplifier 21 is not particularly limited.

Duplexer 61 has a passband including communication band A. Duplexer 61 transfers transmission signals and reception signals in communication band A using frequency-division duplexing (FDD). Duplexer 61 includes transmission filter 61T and reception filter 61R.

Transmission filter 61T is connected between switch 51 and antenna connection terminal 100. Transmission filter 61T passes, among the radio frequency transmission signals amplified by power amplifier 11, signals in a transmission bandwidth of communication band A.

Reception filter 61R is connected between switch 52 and antenna connection terminal 100. Reception filter 61R passes, among the radio frequency reception signals inputted from antenna connection terminal 100, signals in a reception bandwidth of communication band A.

Duplexer 62 has a passband including communication band B different from communication band A. Duplexer 62 transfers transmission signals and reception signals in communication band B using FDD. Duplexer 62 includes transmission filter 62T and reception filter 62R.

Transmission filter 62T is connected between switch 51 and antenna connection terminal 100. Transmission filter 62T passes, among the radio frequency transmission signals amplified by power amplifier 11, signals in a transmission bandwidth of communication band B.

Reception filter 61R is connected between switch 52 and antenna connection terminal 100. Reception filter 62R passes, among the radio frequency reception signals inputted from antenna connection terminal 100, signals in a reception bandwidth of communication band B.

It should be noted that, for example, an LTE band, a 5G NR band, and a WLAN band can be used as communication bands A and B. The present embodiment, however, is not limited to these examples.

Switch 51 is connected between transmission filters 61T and 62T and power amplifier 11. Specifically, switch 51 includes terminals 511 to 513. Terminal 511 is connected to the output of power amplifier 11. Terminals 512 and 513 are connected to transmission filters 61T and 62T, respectively. In this connection configuration, switch 51 is capable of connecting one of terminals 512 and 513 to terminal 511, based on a control signal from RFIC 3, for example. To put it another way, switch 51 is capable of switching between connecting power amplifier 11 and transmission filter 61T and connecting power amplifier 11 and transmission filter 62T. Switch 51 is configured of, for example, a single-pole double-throw (SPDT) switch circuit and is referred to as a band selection switch.

Switch 52 is connected between reception filters 61R and 62R and low-noise amplifier 21. Specifically, switch 52 includes terminals 521 to 523. Terminal 521 is connected to the input of low-noise amplifier 21. Terminals 522 and 523 are connected to reception filters 61R and 62R, respectively. In this connection configuration, switch 52 is capable of connecting one of terminals 522 and 523 to terminal 521, based on a control signal from RFIC 3, for example. To put it another way, switch 52 is capable of switching between connecting low-noise amplifier 21 and reception filter 61R and connecting low-noise amplifier 21 and reception filter 62R. Switch 52 is configured of, for example, an SPDT switch circuit and is referred to as an LNA IN switch.

Switch 53 is connected between antenna connection terminal 100 and duplexers 61 and 62. Specifically, switch 53 includes terminals 531 to 533. Terminal 531 is connected to antenna connection terminal 100. Terminals 532 and 533 are connected to duplexers 61 and 62, respectively. In this connection configuration, switch 53 is capable of connecting at least one of terminals 532 and 533 to terminal 531, based on a control signal from RFIC 3, for example. In other words, switch 53 is capable of switching between connecting and disconnecting antenna 2 and duplexer 61, and switching between connecting and disconnecting antenna 2 and duplexer 62. Switch 53 is configured of, for example, a multi-connection switch circuit and is referred to as an antenna switch.

Switch 54 is connected between radio frequency input terminals 111 and 112 and power amplifier 11. Specifically, switch 54 includes terminals 541 to 543. Terminal 541 is connected to the input of low-noise amplifier 11. Terminals 542 and 543 are connected to radio frequency input terminals 111 and 112, respectively. In this connection configuration, switch 54 is capable of connecting one of terminals 542 and 543 to terminal 541, based on a control signal from RFIC 3, for example. In other words, switch 54 is capable of switching between connecting radio frequency input terminal 111 and power amplifier 11 and connecting radio frequency input terminal 112 and power amplifier 11. Switch 54 is configured of, for example, an SPDT switch circuit and is referred to as a transmission input switch.

Matching circuit 71 is connected between power amplifier 11 and transmission filters 61T and 62T. Specifically, matching circuit is connected between the output of power amplifier 11 and terminal 511 of switch 51. Matching circuit 71 is capable of performing impedance matching between power amplifier 11 and transmission filters 61T and 62T.

Matching circuit 72 is connected between low-noise amplifier 21 and reception filters 61R and 62R. Specifically, matching circuit 72 is connected between the input of power amplifier 21 and terminal 521 of switch 52. Matching circuit 72 is capable of performing impedance matching between power amplifier 21 and reception filters 61R and 62R.

It should be noted that radio frequency module 1 need not include some of the circuit elements shown by FIG. 1. For example, radio frequency module 1 may include at least power amplifier 11, inductor 12, power supply terminal 131, low-noise amplifier 21, and matching circuit 72. Radio frequency module 1 need not include the other circuit elements.

The circuit configuration of radio frequency module 1 makes it possible to communicate transmission signals and reception signals using FDD. A circuit configuration of a radio frequency module according to the present disclosure is not limited to this example. For example, the radio frequency module according to the present disclosure may include a circuit configuration that makes it possible to communicate transmission signals and reception signals using time-division duplexing (TDD), or may include a circuit configuration that makes it possible to communication transmission signals and reception signals using both FDD and TDD.

[1.2 Component Layout of Radio Frequency Module 1]

Next, the component layout of radio frequency module 1 thus configured will be described in detail with reference to FIG. 2 and FIG. 3.

Figure 2:
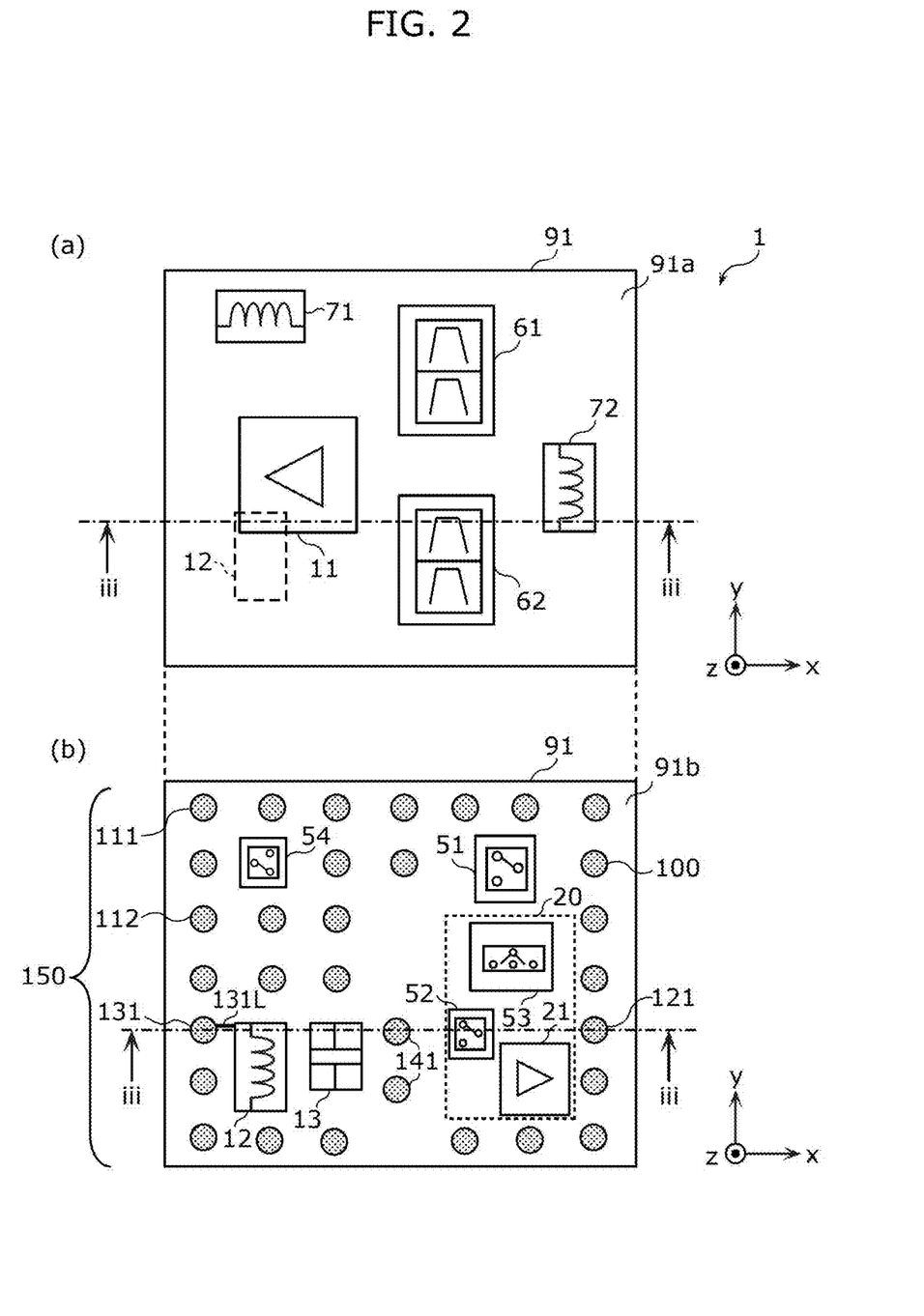
FIG. 2 is a plan view of the radio frequency module according to Embodiment 1.

FIG. 2 is a plan view of radio frequency module 1 according to Embodiment 1, and has two parts, (a) and (b) that show opposite sides of the module substrate 91. In FIG. 2, (a) shows principal surface 91a of module substrate 91 seen from the z-axis positive side, and (b) shows principal surface 91b of module substrate 91 seen from the z-axis positive side. In (a) in FIG. 2, the broken line indicates inductor 12 disposed on principal surface 91b of module substrate 91. FIG. 3 is a cross-sectional view of radio frequency module 1 according to Embodiment 1. The cross section of radio frequency module 1 in FIG. 3 is a cross section along line iii-iii in FIG. 2. It should be noted that FIGS. 2 and 3 show only part of lines and conductors on and within module substrate 91.

Figure 3:
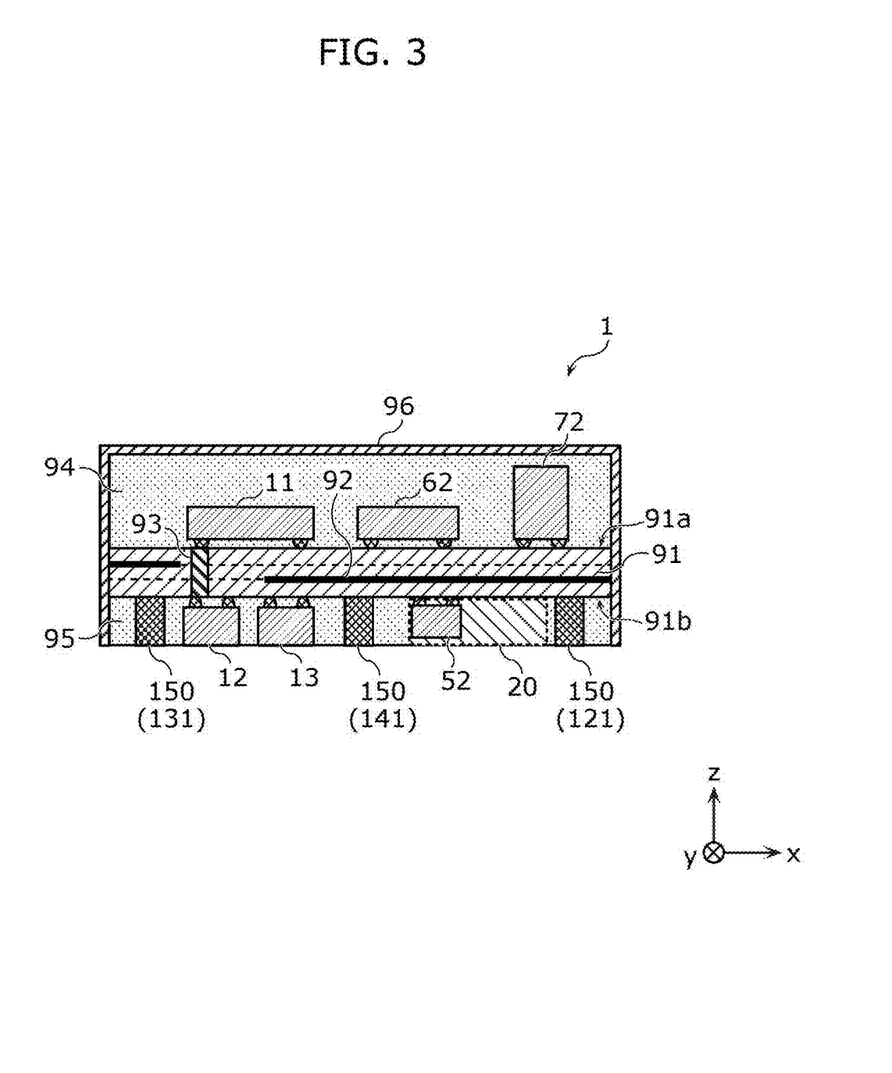
FIG. 3 is a cross-sectional view of the radio frequency module according to Embodiment 1.

As shown by FIGS. 2 and 3, radio frequency module 1 further includes module substrate 91, resin components 94 and 95, shield electrode 96, and post electrodes 150, in addition to the circuit components included in the circuit shown by FIG. 1. It should be noted that resin components 94 and 95 and shield electrode 96 are omitted from FIG. 2.

Module substrate 91 includes principal surface 91a and principal surface 91b on the opposite sides of module substrate 91. Examples of module substrate 91 include a low temperature co-fired ceramic (LTCC) substrate having a layered structure of dielectric layers, a high temperature co-fired ceramic (HTCC) substrate, a component-embedded substrate, a substrate having a redistribution layer (RDL), a printed substrate, or the like. The present embodiment, however, is not limited to these examples. Module substrate 91 includes ground electrode pattern 92.

Principal surface 91a is an example of a first principal surface and may be referred to as an upper surface or a front surface. As shown by (a) in FIG. 2 and FIG. 3, power amplifier 11, duplexers 61 and 62, matching circuits 71 and 72, and resin component 94 are disposed on principal surface 91a.

Each of duplexers 61 and 62 may be, for example, one of a surface acoustic wave filter, an acoustic wave filter using bulk acoustic waves (BAWs), an LC resonance filter, and a dielectric filter. Besides, duplexes 61 and 62 are not limited to these examples.

Matching circuits 71 and 72 each include, for example, an inductor and/or a capacitor, and are each configured of a surface mount device (SMD). It should be noted that matching circuits 71 and 72 may be included by module substrate 91 and may each be configured of an integrated passive device (IPD).

Resin component 94 covers the circuit components on principal surface 91a. Resin component 94 has a function of ensuring reliability such as mechanical strengths and moisture resistances of the components on principal surface 91a.

Principal surface 91b is an example of a second principal surface and may be referred to as a lower surface or a rear surface. As shown by (b) in FIG. 2 and FIG. 3, inductor 12, capacitor 13, semiconductor device 20 including low-noise amplifier 21 and switches 52 and 53, switches 51 and 54, resin component 95, and post electrodes 150 are disposed on principal surface 91b.

Inductor 12 is disposed adjacent to post electrodes 150 constituting power supply terminal 131, and is connected to power supply terminal 131 via line 131L. Specifically, a distance between inductor 12 and post electrodes 150 constituting power supply terminal 131 is less than or equal to a distance between inductor 12 and each of other post electrodes 150. Moreover, inductor 12 is disposed closer to post electrodes 150 constituting power supply terminal 131 than to semiconductor device 20.

As shown by (a) in FIG. 2, inductor 12 overlaps power amplifier 11 in a plan view of module substrate 91. Moreover, inductor 12 does not overlap matching circuit 72.

Inductor 12 is connected to power amplifier 11 via conductor 93 disposed in module substrate 91. Via conductor 93 is a conductor filled in a via provided in module substrate 91, and a material of via conductor 93 is not particularly limited. It should be noted that via conductor 93 may include a conductor filled in a through via, and may include conductors filled in two blind vias, and an electrode pattern connecting these conductors in module substrate 91.

Ground electrode pattern 92 is disposed between inductor 12 and matching circuit 72. Ground electrode pattern 92 is an example of an electrode pattern and is set to a ground potential. It should be noted that an electrode pattern need not be ground electrode pattern 92 and not be set to a ground potential.

Semiconductor device 20 is an electronic component in which electronic circuits are provided on the surface of and inside a semiconductor chip (also referred to as a die), and is also referred to as a semiconductor integrated circuit. Semiconductor device 20 may be configured of, for example, a complementary metal-oxide-semiconductor (CMOS), and may be specifically configured using a silicon on insulator (SOI) structure. This makes it possible to manufacture semiconductor device 20 at low cost. It should be noted that semiconductor device 20 may include at least one of GaAs, SiGe, or GaN. This makes it possible to achieve high-quality semiconductor device 20.

Resin component 95 covers the circuit components on principal surface 91b. Resin component 95 has a function of ensuring reliability such as mechanical strengths and moisture resistances of the components on principal surface 91b.

Post electrodes 150 constitute external connection terminals including antenna connection terminal 100, radio frequency input terminals 111 and 112, radio frequency output terminal 121, power supply terminal 131, and ground terminals 141. Post electrodes 150 are disposed on principal surface 91b of module substrate 91 and extend vertically from principal surface 91b. In addition, post electrodes 150 penetrate through resin component 95, and ends of post electrodes 150 are exposed from resin component 95. The ends of post electrodes 150 exposed from resin component 95 are connected to, for example, input-output terminals and/or ground electrodes on a mother board disposed on radio frequency module 1 in the negative direction of the z-axis.

Post electrodes 150 constituting ground terminals 141 are disposed between inductor 12 and semiconductor device 20. Ground terminal 141 is set to a ground potential. Post electrodes 150 constituting ground terminals 141 are connected to, for example, the ground electrodes on the mother board.

Shield electrode 96 is a metal film provided by, for example, spattering, and covers an upper surface and a side surface of resin component 94 and side surfaces of module substrate 91 and resin component 95. Shield electrode 96 is set to a ground potential and inhibits infiltration of external noise into the circuit components included in radio frequency module 1.

[1.3 Advantageous Effects Etc.]

As stated above, radio frequency module 1 according to the present embodiment includes: power amplifier 11; inductor 12 connected to power amplifier 11; power supply terminal 131 that is an external connection terminal which is connected to the power amplifier via the inductor and is for receiving power supply voltage from an outside; low-noise amplifier 21; matching circuit 72 connected to input of low-noise amplifier 21; and module substrate 91 including principal surfaces 91a and 91b on opposite sides of module substrate 91. Inductor 12 is disposed on one of principal surfaces 91a and 91b, and matching circuit 72 is disposed on the other of principal surfaces 91a and 91b.

With this configuration, since it is possible to dispose components on both sides of module substrate 91, it is possible to downsize radio frequency module 1, compared to a case in which components are disposed on only one of the sides of module substrate 91. Moreover, when the downsizing of radio frequency module 1 reduces a physical distance between the components, it is possible to dispose inductor 12 connected to a transmission path and matching circuit 72 connected to a reception path on the opposite sides of module substrate 91. Accordingly, it is possible to reduce magnetic field coupling between inductor 12 and matching circuit 72, and to improve the electrical characteristics (especially reception performance) of radio frequency module 1.

Moreover, for example, in radio frequency module 1 according to the present embodiment, inductor 12 and power supply terminal 131 may be disposed on principal surface 91b, and matching circuit 72 may be disposed on principal surface 91a.

With this configuration, it is possible to dispose inductor 12 and power supply terminal 131 on the same principal surface, and to readily reduce the length of line 131L between inductor 12 and power supply terminal 131. For this reason, it is possible to prevent power supply noise emitted from line 131L between inductor 12 and power supply terminal 131 from interfering other lines, and to improve the electrical characteristics of radio frequency module 1.

Moreover, for example, radio frequency module 1 according to the present embodiment may further include an electrode pattern in module substrate 91, and the electrode pattern may be disposed between inductor 12 and matching circuit 72.

With this configuration, the electrode pattern disposed between inductor 12 and matching circuit 72 makes it possible to reduce magnetic field coupling between inductor 12 and matching circuit 72, and it is possible to further improve the electrical characteristics of radio frequency module 1.

Moreover, for example, in radio frequency module 1 according to the present embodiment, the electrode pattern may be ground electrode pattern 92 that is set to a ground potential.

With this configuration, ground electrode pattern 92 disposed between inductor 12 and matching circuit 72 makes it possible to reduce magnetic field coupling between inductor 12 and matching circuit 72, and it is possible to further improve the electrical characteristics of radio frequency module 1.

Moreover, for example, in radio frequency module 1 according to the present embodiment, power amplifier 11 may be disposed on principal surface 91a, and low-noise amplifier 21 may be disposed on principal surface 91b.

With this configuration, it is possible to dispose power amplifier 11 and low-noise amplifier 21 on the opposite sides of module substrate 91, and to improve isolation characteristics between transmission and reception.

Moreover, for example, in radio frequency module 1 according to the present embodiment, inductor 12 and power supply terminal 131 may be disposed on principal surface 91b.

With this configuration, it is possible to dispose inductor 12 and power supply terminal 131 on the same principal surface, and to readily reduce the length of line 131L between inductor 12 and power supply terminal 131. For this reason, it is possible to prevent power supply noise emitted from line 131L between inductor 12 and power supply terminal 131 from interfering other lines, and to improve the electrical characteristics of radio frequency module 1.

Moreover, for example, in radio frequency module 1 according to the present embodiment, power amplifier 11 may be disposed on principal surface 91a.

With this configuration, it is possible to dispose power amplifier 11 on principal surface 91a opposing inductor 12 and power supply terminal 131. For this reason, it is possible to prevent power supply noise emitted from line 131L between inductor 12 and power supply terminal 131 from interfering power amplifier 11.

Moreover, for example, in radio frequency module 1 according to the present embodiment, power amplifier 11 overlaps inductor 12 in a plan view of module substrate 91.

With this configuration, it is possible to reduce the length of a line between power amplifier 11 and inductor 12. For this reason, it is possible to reduce a mismatching loss due to a wiring loss or a variation in wiring, and to further improve the electrical characteristics of radio frequency module 1.

Moreover, for example, radio frequency module 1 according to the present embodiment may further include semiconductor device 20 including at least one of low-noise amplifier 21 or switch 53 connected between low-noise amplifier 21 and antenna connection terminal 100, and semiconductor device 20 may be disposed on principal surface 91b.

With this configuration, it is possible to dispose semiconductor device 20 the height of which is relatively easily reduced on principal surface 91b of module substrate 91, to reduce the length of power supply terminal 131 etc., and to reduce the height of entire radio frequency module 1.

Moreover, for example, radio frequency module 1 according to the present embodiment may further include ground terminal 141 that is a second external connection terminal which is set to a ground potential, and ground terminal 141 may be disposed on principal surface 91b, between inductor 12 and semiconductor device 20.

With this configuration, ground terminal 141 makes it possible to reduce magnetic field coupling between inductor 12 and semiconductor device 20. For this reason, it is possible to prevent power supply noise from interfering semiconductor device 20, and to improve the electrical characteristics radio frequency module 1.

Moreover, for example, in radio frequency module 1 according to the present embodiment, inductor 12 may be disposed closer to power supply terminal 131 than to semiconductor device 20.

With this configuration, it is possible to surely reduce the length of line 131L between inductor 12 and power supply terminal 131. For this reason, it is possible to prevent power supply noise emitted from line 131L between inductor 12 and power supply terminal 131 from interfering other lines, and to improve the electrical characteristics of radio frequency module 1.

Moreover, for example, radio frequency module 1 according to the present embodiment may further include a plurality of third external connection terminals disposed on principal surface 91b, and a distance between inductor 12 and power supply terminal 131 may be less than or equal to a distance between inductor 12 and each of the plurality of third external connection terminals.

With this configuration, it is possible to surely reduce the length of line 131L between inductor 12 and power supply terminal 131. For this reason, it is possible to prevent power supply noise emitted from line 131L between inductor 12 and power supply terminal 131 from interfering other lines, and to improve the electrical characteristics of radio frequency module 1.

Moreover, for example, radio frequency module 1 according to the present embodiment may further include capacitor 13 connected between a ground and a path connecting inductor 12 and power supply terminal 131.

With this configuration, capacitor 13 makes it possible to reduce a variation in power supply voltage, and it is possible to prevent power supply noise from flowing into a radio frequency signal line.

Communication device 5 according to the present embodiment includes RFIC 3 that processes a radio frequency signal, and radio frequency module 1 that transfers the radio frequency signal between RFIC 3 and antenna 2.

With this configuration, communication device 5 can produce the same advantageous effects as radio frequency module 1.

Embodiment 2

Next, Embodiment 2 will be described. The present embodiment mainly differs from Embodiment 1 in that an inductor is disposed in a module substrate. The following describes the present embodiment with reference to the drawings, mainly focusing on differences from Embodiment 1.

It should be noted that since a circuit configuration of radio frequency module 1A according to the present embodiment is the same as that described in Embodiment 1 except for including inductor 12A instead of inductor 12, illustration and description thereof is omitted.

[2.1 Component Layout of Radio Frequency Module 1A]

Figure 4:
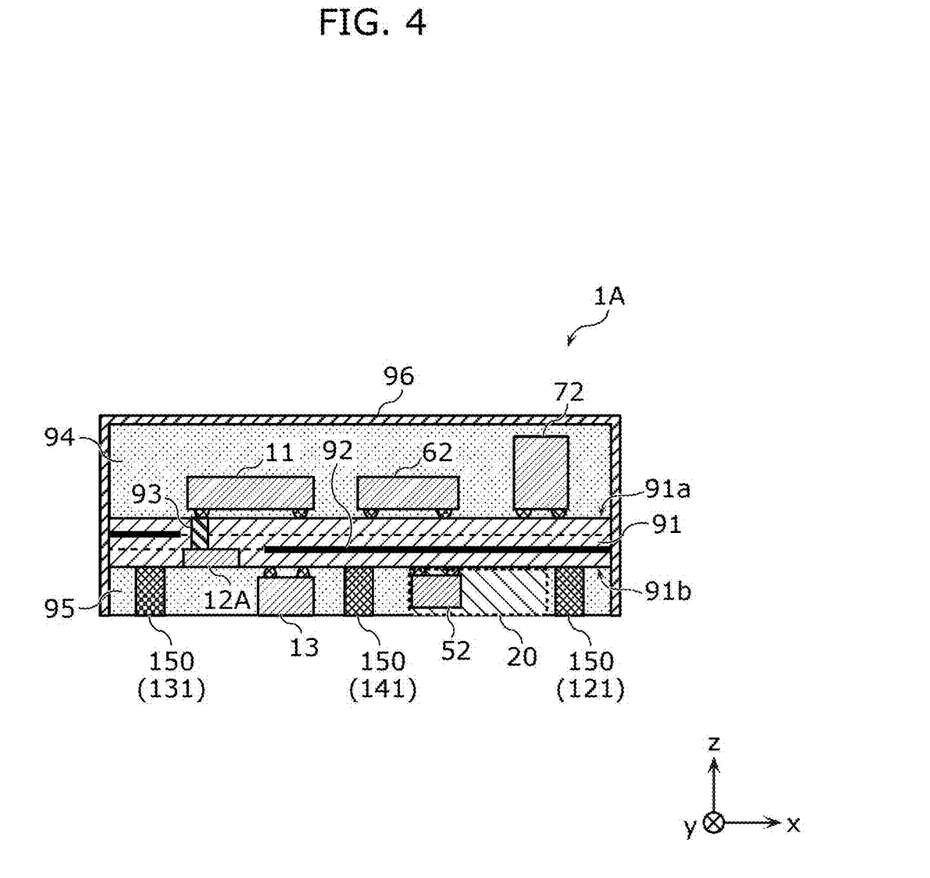
FIG. 4 is a cross-sectional view of a radio frequency module according to Embodiment 2.

The circuit configuration of radio frequency module 1A according to the present embodiment will be described with reference to FIG. 4. FIG. 4 is a cross-sectional view of radio frequency module 1A according to Embodiment 2.

In the present embodiment, inductor 12A is disposed in module substrate 91. In this context, "in the module substrate" means that at least a portion, or an entirety, of the inductor 12A is disposed beneath a principal surface (91a or 91b) of the module substrate 91, such that from a side view of a cross-section of the module substrate 91, at least a portion of inductor 12A would overlap a portion of the cross-section of module substrate 91. In FIG. 4, inductor 12A is disposed on a principal surface 91b side in module substrate 91. In other words, inductor 12A is disposed closer to principal surface 91b than to principal surface 91a in module substrate 91.

Specifically, inductor 12A is formed of, for example, a wiring pattern in module substrate 91. The present embodiment, however, is not limited to this example. For example, inductor 12A may be configured of an IPD, and may be embedded in a cavity in module substrate 91.

Since the layout of the other components is the same as that described in Embodiment 1, description thereof is omitted.

[2.2 Advantageous Effects Etc.]

As stated above, radio frequency module 1A according to the present embodiment includes: power amplifier 11; inductor 12A connected to power amplifier 11; power supply terminal 131 that is an external connection terminal which is connected to power amplifier 11 via inductor 12A and is for receiving power supply voltage from outside; low-noise amplifier 21; matching circuit 72 connected to input of low-noise amplifier 21; and module substrate 91 including principal surface 91a and principal surface 91b on opposite sides of module substrate 91. Inductor 12A is disposed in module substrate 91, and matching circuit 72 is disposed on one of principal surfaces 91a and 91b.

With this configuration, since it is possible to dispose components inside and on both sides of module substrate 91, it is possible to downsize radio frequency module 1, compared to a case in which components are disposed on only one of the sides of module substrate 91. Moreover, when the downsizing of radio frequency module 1A reduces a physical distance between the components, it is possible to dispose inductor 12A connected to a transmission path in module substrate 91, and to dispose matching circuit 72 connected to a reception path on principal surface 91a or 91b of module substrate 91. Accordingly, it is possible to reduce magnetic field coupling between inductor 12A and matching circuit 72, and to improve the electrical characteristics (especially reception performance) of radio frequency module 1A.

Moreover, for example, in radio frequency module 1A according to the present embodiment, power supply terminal 131 may be disposed on principal surface 91b, inductor 12A may be disposed on a principal surface 91b side in module substrate 91, and matching circuit 72 may be disposed on principal surface 91a.

With this configuration, it is possible to further reduce magnetic field coupling between inductor 12A and matching circuit 72 by disposing inductor 12A on a principal surface 91b side in module substrate 91. Moreover, it is possible to readily reduce the length of line 131L between power supply terminal 131 disposed on principal surface 91b and inductor 12A. For this reason, it is possible to prevent power supply noise emitted from line 131L between inductor 12A and power supply terminal 131 from interfering other lines, and to improve the electrical characteristics of radio frequency module 1A.

Moreover, for example, radio frequency module 1A according to the present embodiment may further include an electrode pattern in module substrate 91, and the electrode pattern may be disposed between inductor 12A and matching circuit 72.

With this configuration, the electrode pattern disposed between inductor 12A and matching circuit 72 makes it possible to reduce magnetic field coupling between inductor 12A and matching circuit 72, and it is possible to further improve the electrical characteristics of radio frequency module 1A.

Moreover, for example, in radio frequency module 1A according to the present embodiment, the electrode pattern may be ground electrode pattern 92 that is set to a ground potential.

With this configuration, ground electrode pattern 92 makes it possible to reduce magnetic field coupling between inductor 12A and matching circuit 72, and it is possible to further improve the electrical characteristics of radio frequency module 1A.

Moreover, for example, in radio frequency module 1A according to the present embodiment, power amplifier 11 may be disposed on principal surface 91a, and low-noise amplifier 21 may be disposed on principal surface 91b.

With this configuration, it is possible to dispose power amplifier 11 and low-noise amplifier 21 on the opposite sides of module substrate 91, and to improve isolation characteristics between transmission and reception.

Communication device 5 according to the present embodiment includes RFIC 3 that processes a radio frequency signal, and radio frequency module 1A that transfers the radio frequency signal between RFIC 3 and antenna 2.

With this configuration, communication device 5 can produce the same advantageous effect as radio frequency module 1A.

Other Embodiments

Although the radio frequency modules and the communication devices according to the present disclosure have been described based on the aforementioned embodiments, the radio frequency modules and the communication devices according to the present disclosure are not limited to the aforementioned embodiments. The present disclosure includes other embodiments achieved by combining any of the elements in the aforementioned embodiments, variations resulting from various modifications to the aforementioned embodiments that may be conceived by those skilled in the art without departing from the essence of the present disclosure, and various devices that include the radio frequency modules and the communication devices.

For example, in the circuit configurations of the radio frequency module and the communication device according to each of the aforementioned embodiments, any circuit element, any line, etc. may be inserted in a path connecting the circuit elements and signal paths disclosed by the figures. For example, a matching circuit may be connected between switch 53 and duplexer 61 and/or duplexer 62.

It should be noted that the component layout in each of the aforementioned embodiments is an example, and the present disclosure is not limited to this example. For example, inductor 12 or 12A may be disposed on principal surface 91a or a principal surface 91a side in module substrate 91, and matching circuit 72 and power supply terminal 131 may be disposed on principal surface 91b. Even in this case, it is possible to reduce magnetic field coupling between inductor 12 or 12A and matching circuit 72.

It should be noted that in the aforementioned embodiments, inductors 12 and 12A overlap power amplifier 11 in a plan view of module substrate 91. The present disclosure, however, is not limited to this example. Even when inductor 12 and/or inductor 12A does not overlap power amplifier 11, it is possible to reduce the length of line 131L between inductor 12 and/or inductor 12A and power supply terminal 131, and to improve the electrical characteristics of radio frequency module 1 and/or radio frequency module 1A.

It should be noted that the locations of power amplifier 11 and low-noise amplifier 21 are not limited to the aforementioned embodiments. For example, low-noise amplifier 21 may be disposed on principal surface 91a, and power amplifier 11 may be disposed on principal surface 91b.

Figure 5:
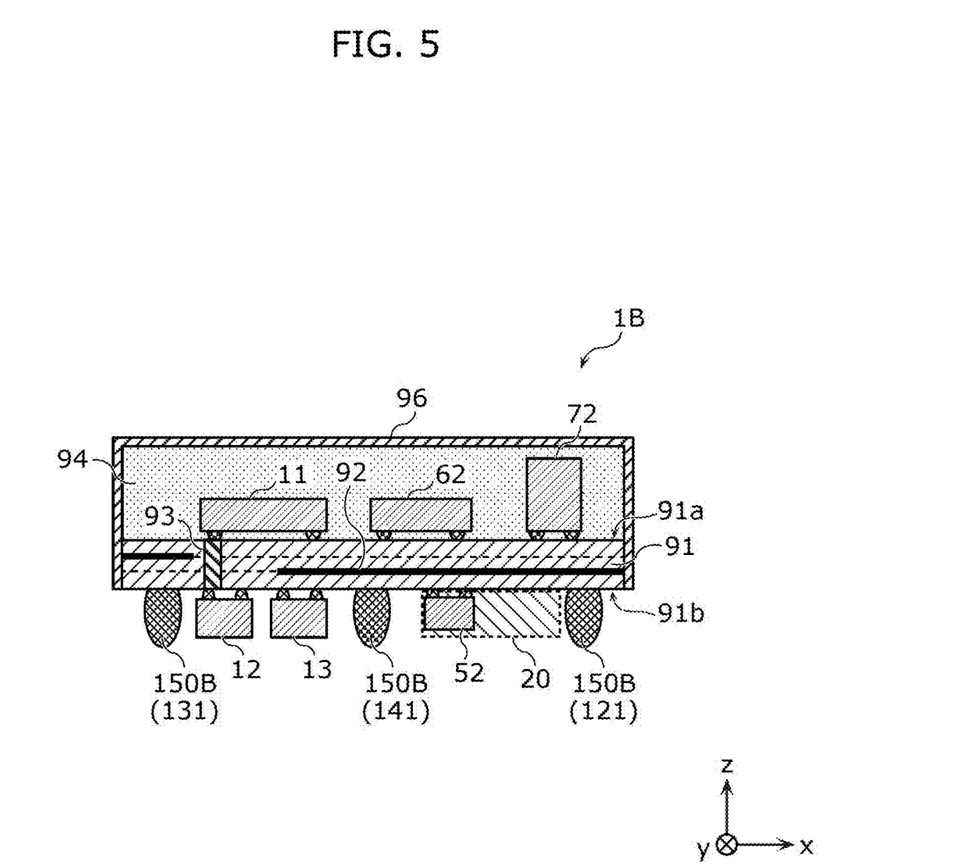
FIG. 5 is a cross-sectional view of a radio frequency module according to another embodiment.

It should be noted that the external connection terminals are composed of post electrodes 150 in the aforementioned embodiments. The present disclosure, however, is not limited to this example. For example, the external connection terminals may be composed of bump electrodes. FIG. 5 is a cross-sectional view of radio frequency module 18 according to another embodiment. Radio frequency module 18 includes bump electrodes 150B instead of post electrodes 150. In this case, radio frequency module 18 need not include resin component 95 covering the circuit components on principal surface 91b.

Accordingly, all such modifications are intended to be included within the scope of the present disclosure. Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as a mobile phone, as a radio frequency module disposed in a front end part.

The invention claimed is:

1. A radio frequency module, comprising:
a power amplifier;
an inductor connected to the power amplifier;
an external connection terminal that is connected to the power amplifier via the inductor and is configured to receive power supply voltage from an outside source;
a low-noise amplifier;
a matching circuit connected to input of the low-noise amplifier; and
a module substrate including a first principal surface and a second principal surface on opposite sides of the module substrate,
wherein the inductor is disposed on one of the first principal surface and the second principal surface, and the matching circuit is disposed on the other of the first principal surface and the second principal surface.

2. The radio frequency module according to claim 1, wherein the inductor and the external connection terminal are disposed on the second principal surface, and the matching circuit is disposed on the first principal surface.

3. The radio frequency module according to claim 1, further comprising:
an electrode pattern in the module substrate,
wherein the electrode pattern is disposed between the inductor and the matching circuit.

4. The radio frequency module according to claim 3, wherein the electrode pattern is a ground electrode pattern that is set to a ground potential.

5. The radio frequency module according to claim 1, wherein the power amplifier is disposed on the first principal surface, and
the low-noise amplifier is disposed on the second principal surface.

6. A radio frequency module, comprising:
a power amplifier;
an inductor connected to the power amplifier;
an external connection terminal that is connected via the inductor to the power amplifier and is configured to receive power supply voltage from an outside source;
a low-noise amplifier;

a matching circuit connected to input of the low-noise amplifier; and a module substrate including a first principal surface and a second principal surface on opposite sides of the module substrate, wherein the inductor is disposed in the module substrate, and the matching circuit is disposed on one of the first principal surface and the second principal surface.

7. The radio frequency module according to claim 6, wherein the external connection terminal is disposed on the second principal surface, the inductor is disposed in the module substrate on a second principal surface side, and the matching circuit is disposed on the first principal surface.

8. The radio frequency module according to claim 6, further comprising:

an electrode pattern in the module substrate, wherein the electrode pattern is disposed between the inductor and the matching circuit.

9. The radio frequency module according to claim 8, wherein the electrode pattern is a ground electrode pattern that is set to a ground potential.

10. The radio frequency module according to claim 6, wherein the power amplifier is disposed on the first principal surface, and the low-noise amplifier is disposed on the second principal surface.

11. A communication device, comprising:

a signal processing circuit configured to process a radio frequency signal; and a radio frequency module configured to transfer the radio frequency signal between the signal processing circuit and an antenna, wherein the radio frequency module including a power amplifier, an inductor connected to the power amplifier, an external connection terminal that is connected to the power amplifier via the inductor and is configured to receive power supply voltage from an outside source, a low-noise amplifier, a matching circuit connected to input of the low-noise amplifier, and a module substrate including a first principal surface and a second principal surface on opposite sides of the module substrate, and wherein the inductor is disposed on one of the first principal surface and the second principal surface, and the matching circuit is disposed on the other of the first principal surface and the second principal surface.

12. The communication device according to claim 11, wherein the inductor and the external connection terminal are disposed on the second principal surface, and the matching circuit is disposed on the first principal surface.

13. The communication device according to claim 11, wherein the radio frequency module further comprising:

an electrode pattern in the module substrate, wherein the electrode pattern is disposed between the inductor and the matching circuit.

14. The communication device according to claim 13, wherein the electrode pattern is a ground electrode pattern that is set to a ground potential.

15. The communication device according to claim 11, wherein the power amplifier is disposed on the first principal surface, and the low-noise amplifier is disposed on the second principal surface.

16. A communication device, comprising:

a signal processing circuit configured to process a radio frequency signal; and the radio frequency module according to claim 6 configured to transfer the radio frequency signal between the signal processing circuit and an antenna.

17. The communication device according to claim 16, wherein the inductor and the external connection terminal are disposed on the second principal surface, and the matching circuit is disposed on the first principal surface.

18. The communication device according to claim 16, wherein the radio frequency module further comprising:

an electrode pattern in the module substrate, wherein the electrode pattern is disposed between the inductor and the matching circuit.

19. The communication device according to claim 18, wherein the electrode pattern is a ground electrode pattern that is set to a ground potential.

20. The communication device according to claim 16, wherein the power amplifier is disposed on the first principal surface, and the low-noise amplifier is disposed on the second principal surface.

* * * * *